United States Patent
Lee et al.

(10) Patent No.: US 10,920,105 B2
(45) Date of Patent: Feb. 16, 2021

(54) MATERIALS AND METHODS FOR CHEMICAL MECHANICAL POLISHING OF RUTHENIUM-CONTAINING MATERIALS

(71) Applicant: Taiwan Semiconductor Manufacturing Co., Ltd., Hsin-Chu (TW)

(72) Inventors: An-Hsuan Lee, Hsinchu (TW); Shen-Nan Lee, Hsinchu County (TW); Chen-Hao Wu, Keelung (TW); Chun-Hung Liao, Taichung (TW); Teng-Chun Tsai, Hsinchu (TW); Huang-Lin Chao, Hillsboro, OR (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/456,918

(22) Filed: Jun. 28, 2019

(65) Prior Publication Data

US 2020/0032105 A1    Jan. 30, 2020

Related U.S. Application Data

(60) Provisional application No. 62/703,916, filed on Jul. 27, 2018.

(51) Int. Cl.
*H01L 21/321* (2006.01)
*C09G 1/02* (2006.01)
*H01L 21/762* (2006.01)

(52) U.S. Cl.
CPC ............ *C09G 1/02* (2013.01); *H01L 21/3212* (2013.01); *H01L 21/76227* (2013.01)

(58) Field of Classification Search
None
See application file for complete search history.

(56) References Cited

U.S. PATENT DOCUMENTS

| 8,981,427 B2 | 3/2015 | Hydrick et al. |
| 9,416,297 B2 | 8/2016 | Hsu et al. |
| 9,530,655 B2 | 12/2016 | Hsu et al. |
| 9,994,736 B2 | 6/2018 | Hsu et al. |
| 2003/0100244 A1* | 5/2003 | Cherian ............... B24D 3/32 451/41 |

(Continued)

OTHER PUBLICATIONS

Loosli, Frederic, et al. "TiO2 Nanoparticles Aggregation and Disaggregation in Presence of Alginate and Suwannee River Humic Acids. pH and Concentration Effects on Nanoparticle Stability," Water Research 47, 2013, pp. 6052-6063.

(Continued)

*Primary Examiner* — Shamim Ahmed
(74) *Attorney, Agent, or Firm* — Haynes and Boone, LLP

(57) ABSTRACT

A chemical mechanical polishing (CMP) slurry composition includes an oxidant including oxygen, and an abrasive particle having a core structure encapsulated by a shell structure. The core structure includes a first compound and the shell structure includes a second compound different from the first compound, where a diameter of the core structure is greater than a thickness of the shell structure, and where the first compound is configured to react with the oxidant to form a reactive oxygen species.

20 Claims, 9 Drawing Sheets

(56) References Cited

U.S. PATENT DOCUMENTS

| | | | |
|---|---|---|---|
| 2003/0162399 A1* | 8/2003 | Singh | C09K 3/1436 |
| | | | 438/692 |
| 2008/0265375 A1 | 10/2008 | Pietsch et al. | |
| 2010/0012976 A1 | 1/2010 | Hydrick et al. | |
| 2011/0130077 A1* | 6/2011 | Litke | C08G 18/10 |
| | | | 451/41 |
| 2013/0005149 A1* | 1/2013 | Li | C09G 1/02 |
| | | | 438/693 |
| 2014/0170852 A1 | 6/2014 | Noller et al. | |
| 2017/0183537 A1* | 6/2017 | Yoon | H01L 21/28079 |
| 2018/0002571 A1* | 1/2018 | Stender | C09K 3/1463 |
| 2018/0036859 A1* | 2/2018 | Lee | H01L 21/02074 |

OTHER PUBLICATIONS

Liu, Tongxu, et al., "Enhanced Visible-Light Photocatalytic Activity of a TiO2 Hydrosol Assisted by H2O2: Surface Complexation and Kinetic Modeling," Journal of Molecular Catalysis A: Chemical, 414, 2016, pp. 122-129.

Sahel, K., et al., "Hydrogen Peroxide and Photocatalysis", Applied Catalysis B: Environmental, 188, 2016, pp. 106-112.

Wang, Chenwei, et al., "Improvement of Ruthenium Polishing Rate by Addition of Guanidinium Ions," International Conference on Planarization/CMP Technology, Oct. 2017, Leuven, Belgium, pp. 385-390.

\* cited by examiner

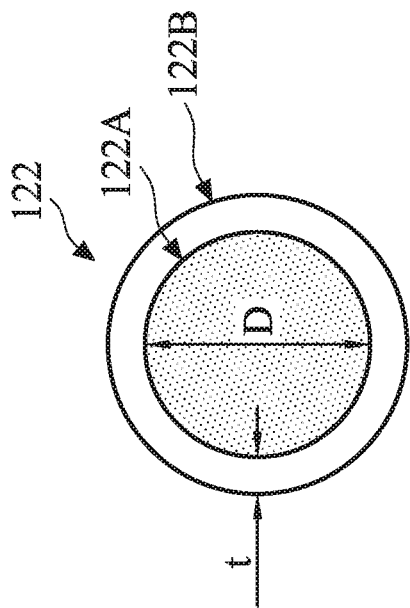
FIG. 2B
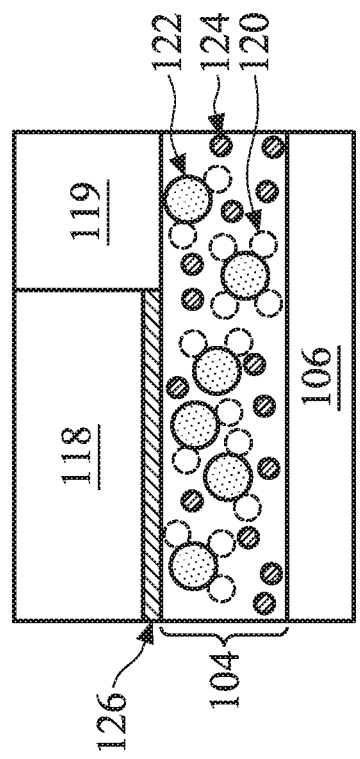
FIG. 2A
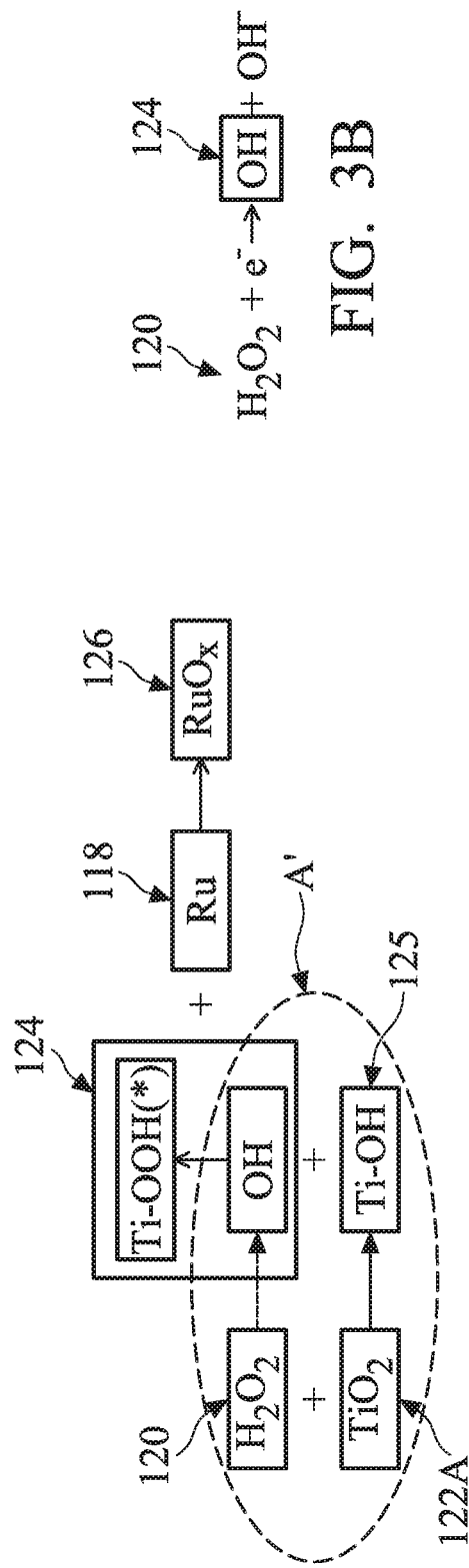
FIG. 3B
FIG. 3A

| Abrasive | $SiO_2$ 2wt% | $TiO_2$ 0.5wt% |
|---|---|---|
| Oxidizer | $H_2O_2$ 1% | $H_2O_2$ 1% |
| Down Force | x | x |
| Ru RR | y | > 6.5y |
| Dielectric RR | z | < 0.07z |
| CMP Selectivity (Ru RR:Dielectric RR) | 1 | > 90 |

FIG. 4

MATERIALS AND METHODS FOR CHEMICAL MECHANICAL POLISHING OF RUTHENIUM-CONTAINING MATERIALS

CROSS-REFERENCE TO RELATED APPLICATIONS

This is a non-provisional application of and claims priority to U.S. Provisional Patent Application Ser. No. 62/703,916, filed on Jul. 27, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

A particular challenge, and one which has become increasingly difficult for reduced device geometries, relates to the planarization of substrates during device fabrication. Chemical mechanical polishing/planarizing (CMP) is a process that has been introduced and used throughout the semiconductor industry for conducting the planarization process. In general, a CMP process may be optimized for specific process conditions such as, for example, the material being polished, device structure, and/or desired polishing (or removal) rate. With the continued advancement of highly-scaled IC technology, bringing with it new materials and new device structures, optimization of CMP processes has not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates an example embodiment of a substrate in contact with an embodiment of a CMP slurry according to one or more aspects of the present disclosure.

FIG. 2B illustrates an embodiment of a portion of a CMP slurry according to one or more aspects of the present disclosure.

FIGS. 3A and 3B illustrate example mechanisms by which an embodiment of a CMP slurry functions according to one or more aspects of the present disclosure.

FIG. 4 illustrates a table of some embodiments of CMP slurry compositions according to one or more aspects of the present disclosure.

DETAILED DESCRIPTION

Figure 1A:
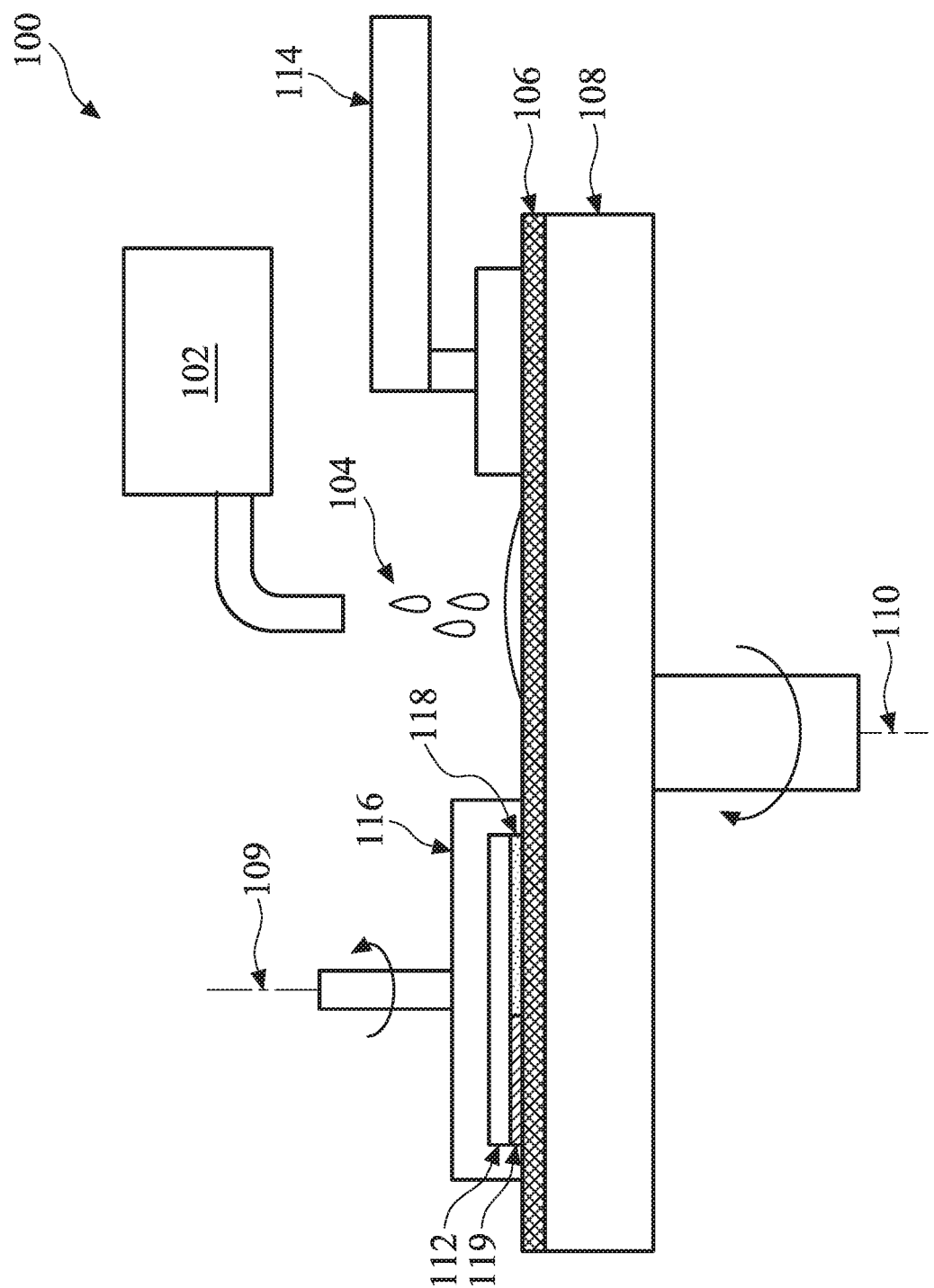
FIG. 1A illustrates a chemical mechanical polishing/planarizing (CMP) system according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

It is also noted that the present disclosure presents embodiments of chemical mechanical polishing/planarizing (CMP) processes, including CMP slurries, useful for the fabrication of planar, multi-gate, gate-all-around (GAA), Omega-gate (Ω-gate), or Pi-gate (Π-gate) devices. In some embodiments, such a device may include a P-type metal-oxide-semiconductor (PMOS) device and/or an N-type metal-oxide-semiconductor (NMOS) device. In one example, the present disclosure is directed to a FinFET device. Embodiments of the present disclosure may be equally applicable to fabrication of other devices not discussed above.

During a CMP process, a surface of a substrate is acted upon by a slurry and a polishing pad. For example, a force may be applied to press the substrate against the pad while the substrate and the pad are rotated. The rotation and the substrate-to-pad force, in conjunction with the slurry supplied to the substrate, serve to remove substrate material and thus planarize the surface of the substrate. Generally, the CMP slurry may include at least an oxidant to oxidize the material on the surface to be removed, as well as an abrasive to mechanically remove the oxidized material. As used herein, a "slurry" includes an aqueous mixture having a chemical composition that may enhance, reduce, or otherwise modify a substrate polishing rate. For example, effectiveness of a CMP slurry may be evaluated based on a removal rate (RR) of the material of interest as well as a removal selectivity relative a surrounding material.

As semiconductor device sizes continue to shrink, it has become increasingly difficult to meet device planarization requirements in fabrication. For example, the formation of interconnect features (e.g., vias, conductive lines, etc.) as part of a semiconductor device fabrication process generally requires a planarization step following deposition of a conductive material. In particular, CMP of noble metals such as ruthenium (Ru) has introduced new challenges to semiconductor device fabrication. For example, due to the noble nature and the high hardness of Ru, a CMP slurry including hydrogen peroxide as the oxidant and colloidal silica as the abrasive may not be entirely adequate to achieve a desired Ru RR and removal selectivity with respect to a dielectric material disposed surrounding it. On one hand, the noble nature of Ru limits its oxidation by the oxidant hydrogen peroxide; on the other hand, the high hardness of Ru renders the polishing power of colloidal silica less effective. As such, an overall Ru RR may be saturated at about 50 Angstrom/min. Additionally, removal selectivity between Ru and a surrounding dielectric material (e.g., oxide-based dielectric material) may also be limited. Therefore, for these and other reasons, improvements in CMP slurries are desirable in fabricating Ru-containing devices.

Referring to FIG. 1A, a CMP system 100 is illustrated. The CMP system 100 includes a slurry source 102 configured to distribute a slurry 104 onto a surface of a polishing pad 106. As shown in FIG. 1A, the polishing pad 106 is disposed on a platen 108, which rotates the polishing pad 106 about an axis of rotation 110 during operation of the CMP system 100. The rotation of the polishing pad 106 transports the slurry 104 underneath a semiconductor substrate (hereafter referred to as "substrate") 112. Thus, the polishing pad 106, in conjunction with the slurry 104, serves to polish the substrate 112. A pad conditioner 114, which may include a diamond grit conditioning pad, is configured to push on the polishing pad 106 with a downward force such that the diamond grit is brought into contact with the polishing pad 106. As the polishing pad 106 is rotated by the platen 108, the diamond grit roughens the surface of the polishing pad 106 to provide for improved mechanical polishing. It is understood that the FIG. 1A is only an example, and other embodiments of a CMP system and removal mechanism are also within the scope of the present disclosure.

The CMP system 100 further includes a workpiece carrier 116 that is configured to house the substrate 112 during the CMP process. In various embodiments, the substrate 112 is positioned in an upside-down orientation within the workpiece carrier 116 so that a top surface of the substrate 112 faces the polishing pad 106. By way of example, the workpiece carrier 116 is operable to bring the substrate 112 into contact with the polishing pad 106, for example, such that the top surface of the substrate 112 contacts the polishing pad 106 while the polishing pad 106 rotates. By bringing the substrate 112 into contact with the rotating polishing pad 106, polishing of the substrate 112 is achieved. Additionally, in some embodiments, the workpiece carrier 116 may also be rotated during operation of the CMP system 100 for example, about an axis of rotation 109.

In various embodiments, the substrate 112 may include one or more layers to be polished, such as a Ru-containing layer 118 disposed adjacent a dielectric material layer 119 (e.g., an oxide-containing dielectric layer, such as an interlayer dielectric (ILD) layer). The substrate 112 may include other layers, such as a semiconductor layer (e.g., a silicon-, germanium-, or III-V semiconductor-containing layer) or other suitable material layers. The Ru-containing layer 118 may include at least 10% Ru by weight. In some embodiments, the Ru-containing layer 118 includes substantially pure Ru, i.e., about 100% Ru. Though a thickness of the Ru-containing layer 118 may be different from a thickness of the dielectric material layer 119, the Ru-containing layer 118 and the dielectric material layer 119 both include a top surface that directly faces the rotating polishing pad 106. In such embodiments, the CMP system 100 is configured to polish the Ru-containing layer 118 using a CMP slurry such that its top surface is planarized with that of the dielectric material layer 119.

Figure 1B:
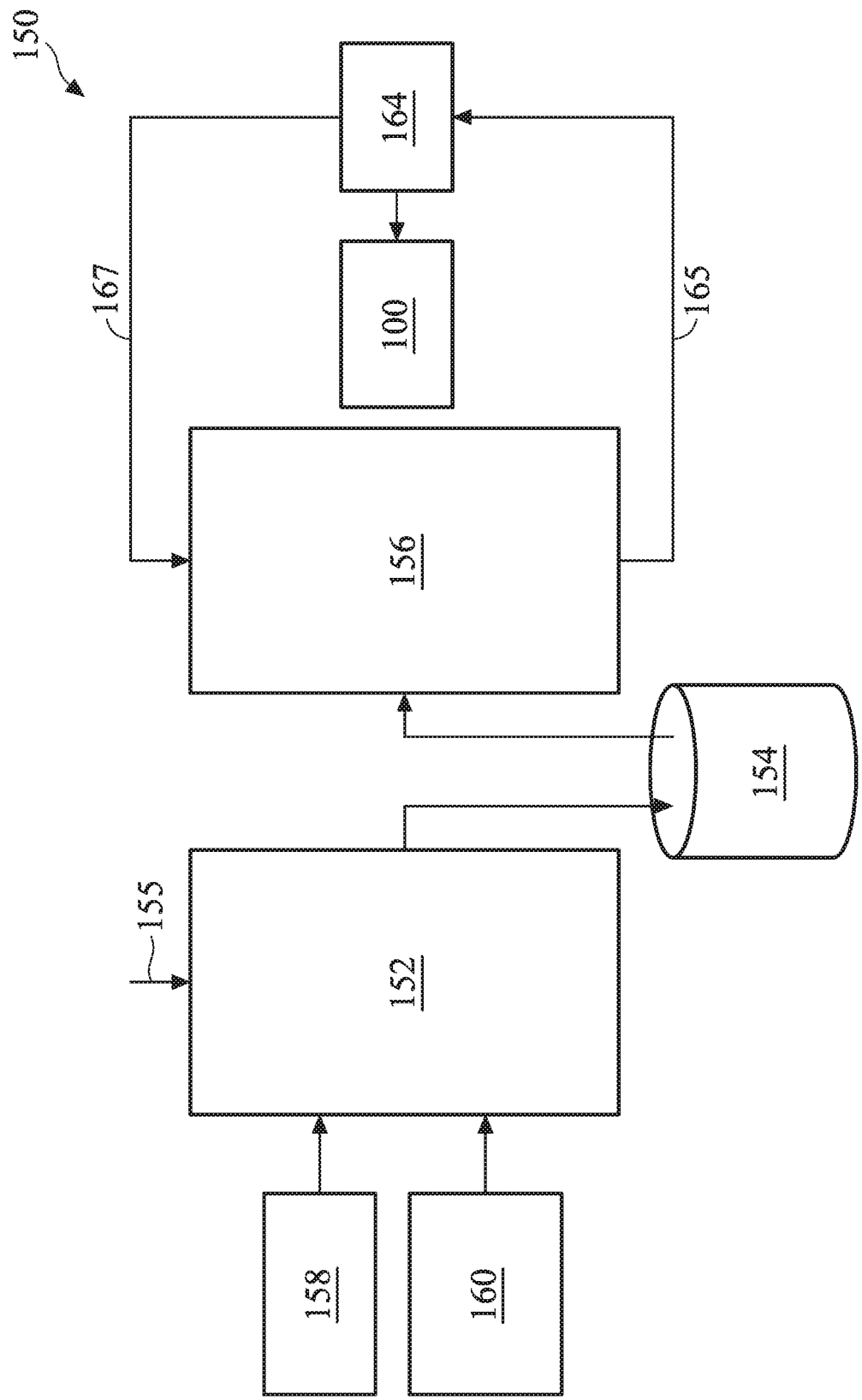
FIG. 1B illustrates a CMP slurry manufacturing and delivery system according to one or more aspects of the present disclosure.

In some embodiments, the CMP system 100 may be implemented within a CMP slurry manufacturing and delivery system 150, as illustrated in FIG. 1B. As shown, the CMP slurry manufacturing and delivery system 150 may include a slurry manufacturing tank 152, one or more slurry storage tanks 154, a slurry day tank 156, an oxidant source 158, an abrasive source 160, and/or other suitable components. In some embodiments, the slurry manufacturing tank 152 is coupled to the oxidant source 158 and the abrasive source 160. In various embodiments, the oxidant source 158 is configured to provide an oxidant to the slurry manufacturing tank 152. In some embodiments, the oxidant provided by the oxidant source 158 may include a compound having oxygen such as hydrogen peroxide, or others as described below. In various embodiments, the abrasive source 160 is configured to provide abrasive particles (discussed in detail below) to be used in conjunction with the oxidant in the slurry manufacturing tank 152. In some embodiments, the slurry manufacturing tank 152 may also include one or more inlets 155 configured to provide de-ionized water (DIW) and/or other components appropriate for making the slurry to the slurry manufacturing tank 152, which are subsequently introduced into the slurry 104. In some cases, inlets 155 may also be provided to deliver one or more of optional additives to the slurry 104, such as an organic complexant, a chelating agent, an organic or inorganic acid/base, a corrosion inhibitor, a buffer, and/or other suitable additives.

In some embodiments, the slurry 104 (e.g., stored in the slurry storage tank 154) may be transported into the slurry day tank 156. In some embodiments, the slurry 104 is provided by way of a transport piping 165 from the slurry day tank 156 to one or more valve manifold boxes (VMB) 164. The VMB 164 are configured to selectively provide the slurry from the transport piping 165 to the CMP system 100, for example, when the CMP system 100 is operated to perform a CMP process on a substrate. In some embodiments, a re-circulation transport piping 167 is configured to return slurry that has not been provided to the CMP system 100 from the one or more VMB 164 to the slurry day tank 156. The slurry day tank 156 is configured to mix any unused slurry with new slurry to maintain a slurry, such as the slurry 104, having a high Ru RR and/or a high Ru-to-dielectric removal selectivity.

The slurry 104 may include an aqueous mixture having a chemical composition that may enhance a polishing rate of the substrate 112. In some embodiments, referring to FIG. 2A, the slurry 104 includes an oxidant 120 (e.g., provided by the oxidant source 158) and an abrasive (e.g., provided by the abrasive source 160) that includes a plurality of abrasive particles 122. In some embodiments, the oxidant 120 includes a compound having oxygen such as hydrogen peroxide ($H_2O_2$). The oxidant 120 may alternatively or additionally include a compound comprising an alkali metal (e.g., sodium, potassium, etc.) and one or more of the following ions: $IO_4^-$, $IO_3^-$, $ClO^-$, $NO_3^-$, $Cl^-$, $CO_3^{2-}$, $SO_4^{2-}$. For example, the oxidant 120 may include $KIO_4$, $NaIO_3$, $KNO_3$, other suitable compounds, or combinations thereof. In some embodiments, a concentration of the oxidant 120 ranges from about 0.1 wt % to about 5 wt %, though the present disclosure is not limited to this numeric range. If the concentration of the oxidant 120 is lower than about 0.1 wt %, the removal of Ru may be trivial and no gain in Ru RR may be obtained. On the other hand, if the concentration of the oxidant 120 is higher than about 5 wt %, the pot life of the slurry 104 may be shortened, comprising the stability of the slurry. In some embodiments, the slurry 104 may include additional components. For example, the slurry 104 may include at least one of amino acids, organic complexants, chelating agents, organic or inorganic acids/bases, corrosion inhibitors, buffers, etch inhibitors, other suitable components, or combinations thereof.

Referring to FIG. 2B, each abrasive particle 122 is configured to have a core-shell structure, where a core structure 122A is encapsulated (or surrounded) by a shell structure 122B, and where the core structure 122A and the shell structure 122B include different compositions. In other words, each abrasive particle 122 has a two-layer structure that includes an inner layer (i.e., the core structure) 122A surrounded by an outer layer (i.e., the shell structure) 122B. In many embodiments, the shell structure 122B is configured to provide a coating for the core structure 122A, such that during the dispersing of the slurry 104 across the surface of the substrate 112 (i.e., the Ru-containing layer 118 and the dielectric material layer 119), the abrasive particles 122 may be stabilized as individual particles and not aggregate to form large masses. The core structure 122A is configured to have at least the same hardness as oxidized ruthenium (e.g., ruthenium oxide to be discussed in detail below), which is greater than a hardness of conventional materials used as abrasive particles such as, for example, $Al_2O_3$ or $SiO_2$. The core structure 122A may be defined by a diameter D, which is substantially larger than a thickness t of the shell structure 122B. In some embodiments, a ratio of t to D ranges from about 0.15 to about 0.5. In some examples, D may range from about 1 nm to about 150 nm, and t may range from about 0.5 nm to about 30 nm. In many embodiments, t may be tuned to achieve a desired Ru RR and/or removal selectivity. For example, an increased t may enhance the stabilizing effect of the abrasive particles 122, such that mechanisms for oxidizing and removing the Ru-containing layer 118 (discussed in detail below) may be carried out more effectively. Furthermore, as a result of enhanced Ru RR, the increased t may also lead to improved removal selectivity relative to the dielectric material layer 119.

The core structure 122A and the shell structure 122B include distinctly different compositions. In some embodiments, the core structure 122A includes a material capable of producing electrons ($e^-$) and/or holes ($h^+$) during a catalytic reaction. For example, in the present embodiments, the core structure 122A includes $TiO_2$, $CeO_2$, $Ce(OH)_x$ (where x=3 or 4), other suitable materials, or combinations thereof. In some embodiments, the shell structure 122B includes $Al_2O_3$, $SiO_2$, other suitable materials, or combinations thereof. In some embodiments, the core structure 122A is free of $Al_2O_3$ and $SiO_2$. In many embodiments, the materials (e.g., $Al_2O_3$ and/or $SiO_2$) included in the shell structure 122B are configured to alter a zeta potential at a surface of the core structure 122A, such that the abrasive particles 122 preferentially interact with the oxidant 120 rather than with themselves, thereby mitigating undesired aggregation of the abrasive particles 122. In other words, the shell structure 122B is configured to stabilize the abrasive particles 122, such that they will be distributed across the surface of the substrate 112 and not aggregate to form large masses. As discussed in detail below, different from the core structure 122A, the shell structure 122B is not configured to chemically react with the oxidant 120. In the present embodiments, the core-shell structure of the abrasive particle 122 is tailored to polishing metal oxides (e.g., ruthenium oxide) generally having a higher hardness than conventional abrasive materials (e.g., $Al_2O_3$ and $SiO_2$) with the additional benefit of providing stability (i.e., preventing particle aggregation) between the abrasive particles 122. It is worth noting that the core-shell structure provided herein presents unique advantages to the CMP slurry of the present disclosure as it would not have been generally desirable to utilize multi-layer abrasive particles due to the additional processing cost and complexity they introduce to the polishing process.

Still referring to FIG. 2A, upon contacting the rotating polishing pad 106 with the Ru-containing layer 118 and the dielectric material layer 119, the shell structure 122B of each abrasive particle 122 may be separated from the core structure 122A as a result of the rotational and downward force applied by the polishing pad 106, thereby exposing the core structure 122A to the oxidant 120. Thereafter, molecules of the oxidant 120 adsorb onto the surface of the core structure 122A, initiating a series of chemical reactions to produce oxidizers including reactive oxygen species (ROS) 124. The ROS 124 then oxidizes Ru in the Ru-containing layer 118 to form a ruthenium oxide ($RuO_x$, where x=2 or 3) layer 126. Because $RuO_x$ generally has a lower hardness than Ru, the $RuO_x$ layer 126 may be more readily removed by the abrasive particles 122 than the Ru-containing layer 118. Additionally, as discussed in detail below, since ROS 124 is generally a stronger oxidizer than the oxidant 120, the rate at which Ru is converted to $RuO_x$ is increased when compared to the rate of conversion using the oxidant 120 alone, thereby improving the overall Ru RR. And because $RuO_x$ generally has a hardness comparable to or lower than the composition of the core structure 122A (e.g., $TiO_2$), the overall Ru RR is improved when the oxidant 120 is applied in conjunction with the abrasive particles 122. In some embodiments, the increased RR of Ru exceeds that of the dielectric material layer 119, such that the removal selectivity between the Ru-containing layer 118 and the dielectric material layer 119 is also improved.

Example embodiments of chemical reactions between components of the slurry 104 are illustrated in FIG. 3A. Using $TiO_2$ as an example composition for the core structure 122A (of course, other compositions such as $CeO_2$, Ce(OH)

$_3$, Ce(OH)$_4$, etc. are also applicable in the present disclosure), the oxidant 120 (e.g., hydrogen peroxide) adsorbed onto the surface of the core structure 122A reacts with TiO$_2$ to produce at least a hydroxide radical (●OH), ionic species 125 including Ti$^{2+}$ and/or OH$^-$ (which may be together referred to as Ti(OH)$_2$), as well as Ti—OOH(*). As discussed above, the core structure 122A includes materials (e.g., TiO$_2$, CeO$_2$, Ce(OH)$_3$, Ce(OH)$_4$, etc.) capable of producing electrons (e$^-$) and/or holes (h$^+$). As such, referring to FIG. 3B, the oxidant 120 reacts with the electrons produced by the core structure 122A to produce the hydroxide radical. Referring back to FIG. 3A, in many embodiments, the hydroxide radical and Ti—OOH(*), collectively known as the ROS 124, are operable for oxidizing Ru in the Ru-containing layer 118 to form the RuO$_x$ layer 126 that includes compounds such as RuO$_2$ and/or RuO$_3$. Notably, the ROS 124 is a stronger oxidizer than hydrogen peroxide, causing the RuO$_x$ layer 126 to be formed at a higher rate than if the oxidant 120 is used alone as an oxidizer. The RuO$_x$ layer 126 may then be polished (i.e., removed) by the abrasive particles 122 (e.g., the core structure 122A). As such, the abrasive particles 122 (or the components thereof) act both as a catalyst for oxidizing Ru as well as a polishing medium for physically removing the resulting RuO$_x$ layer 126 during the CMP process.

FIG. 4 illustrates an example comparison in Ru RR, dielectric RR, and CMP selectivity between using the abrasive particles 122 including TiO$_2$ as the core structure 122A and using colloidal silica (e.g., SiO$_2$) as an abrasive in the CMP process. Specifically, when compared at the same applied downward force (i.e., force applied when contacting the substrate 112 with the polishing pad 106), the Ru RR effected by TiO$_2$ is at least about 6.5 times that of SiO$_2$, while the dielectric RR effected by TiO$_2$ is less than about 0.07 times that of SiO$_2$. Additionally, the CMP or removal selectivity, which is the ratio of Ru RR to dielectric RR, of TiO$_2$ is at least 90 times that of SiO$_2$, indicating a significant increase in the effectiveness of the CMP in polishing the Ru-containing layer 118.

The various embodiments of the slurry 104 described above may provide for improved Ru RR as well as an increased removal selectivity between Ru and a dielectric material disposed adjacent thereto. In many embodiments, the slurry 104 compositions described herein including an oxidant, and abrasive particles having a core-shell structure capable of producing ROS with the oxidant provide for an improved polishing throughput for Ru-containing components (e.g., Ru-containing via), and reduced damage to dielectric components such as ILD layers during a CMP process.

Figure 5:
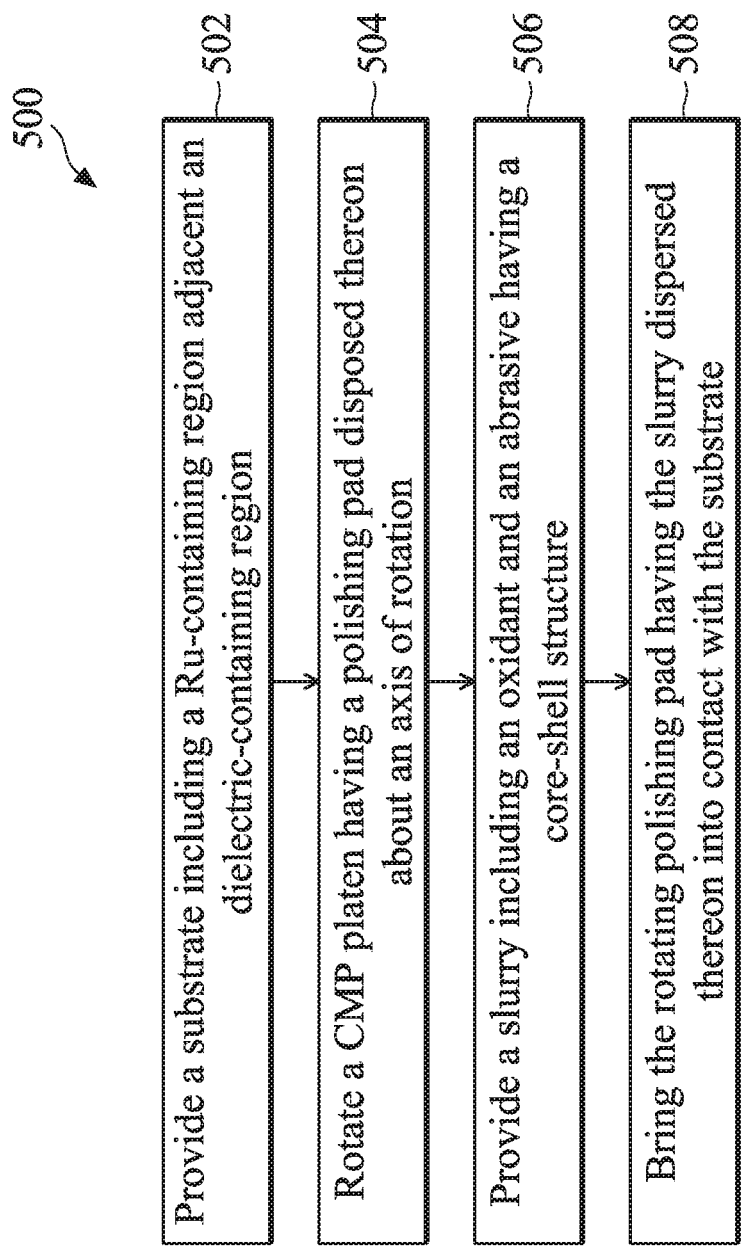
FIG. 5 is a flow chart of a method of performing a CMP process according to one or more aspects of the present disclosure.

FIG. 5 illustrates a method 500 of a CMP process in accordance with one or more of the embodiments described herein. In various examples, the method 500 includes a CMP process having an improved Ru RR and removal selectivity between Ru and a dielectric material. It is understood that the method 500 may include additional steps performed before, after, and/or during the method 500. It is also understood that the process steps of method 500 are merely exemplary and are not intended to be limiting beyond what is specifically recited in the claims that follow.

The method 500 begins at block 502 where a substrate including a Ru-containing region adjacent a dielectric-containing region is provided. In an example embodiment, the substrate may include the substrate 112 provided herein. In addition, the Ru-containing region may include the Ru-containing layer 118, and the dielectric-containing region may include the dielectric material layer 119, which both include a top surface that directly faces the rotating polishing pad 106 as illustrated in FIG. 1A. The Ru-containing region includes at least 10% Ru. The dielectric region may include any suitable dielectric material, such as an oxide-containing material, a nitride-containing material, other suitable dielectric materials, or combinations thereof. In an example, the dielectric region may include silicon oxide.

The method 500 proceeds to block 504 where a CMP platen having a polishing pad disposed thereon is rotated about an axis of rotation. For example, referring to FIG. 1, the polishing pad 106 on the platen 108 may be rotated about the axis of rotation 110 during operation of the CMP system 100.

The method 500 then proceeds to block 506 where a slurry including at least an oxidant and an abrasive in the form of abrasive particles is provided. By way of example, the slurry source 102 may distribute the slurry 104 containing the oxidant 120 and the abrasive particles 122 onto the surface of the polishing pad 106, where the rotation of the polishing pad 106 is configured to disperse the slurry 104 underneath the substrate 112 after the substrate 112 is brought into contact. The oxidant 120 may include any suitable oxidizer, such as hydrogen peroxide, a compound comprising an alkali metal (e.g., sodium, potassium, etc.) and one or more of the following ions: IO$_4^-$, IO$_3^-$, ClO$^-$, NO$_3^-$, Cl$^-$, CO$_3^{2-}$, SO$_4^{2-}$, other suitable oxidizers, or combinations thereof. The abrasive particles 122 may each include a core-shell structure as discussed above with reference to FIG. 2B, where the core structure 122A includes a catalytic material such as TiO$_2$, CeO$_2$, Ce(OH)$_x$ (e.g., x=3 or 4), other suitable materials, or combinations thereof, and the shell structure 122B includes Al$_2$O$_3$, SiO$_2$, other suitable materials, or combinations thereof. The slurry 104 may further include other components as discussed above.

The method 500 then proceeds to block 508 where the rotating polishing pad, having the slurry with the oxidant and the abrasive particles is brought into contact with the substrate that includes the Ru-containing region and the dielectric-containing region. For example, upon being brought into contact with the polishing pad 106, the substrate 112 is polished by the polishing pad 106 using the slurry 104 as a polishing medium. In accordance with some aspects of the present disclosure, referring to FIGS. 2A, 3A, and 3B, when polishing the substrate 112 using the slurry 104 provided herein, the abrasive particles 122 (or a component thereof) react with the oxidant 120 to form ROS 124, which in turn oxidizes Ru to form the RuO$_x$ layer 126 at a higher rate than if using the oxidant 120 alone as the oxidizer. The RuO$_x$ layer 126 may then be physically removed (i.e., polished) using the abrasive particles 122. Notably, the improved Ru RR ensures that the CMP selectivity between Ru and the dielectric material is enhanced, thereby minimizing inadvertent loss of the dielectric material during the CMP process. Additionally, increased Ru RR may also reduce surface roughness of a Ru-containing component in a semiconductor device by as much as two orders of magnitude, e.g., a decrease from about 10 Angstrom to about 0.1 Angstrom, where the surface roughness is defined as an average (i.e., arithmetical mean) deviation from an average thickness of the Ru-containing component.

Figure 6:
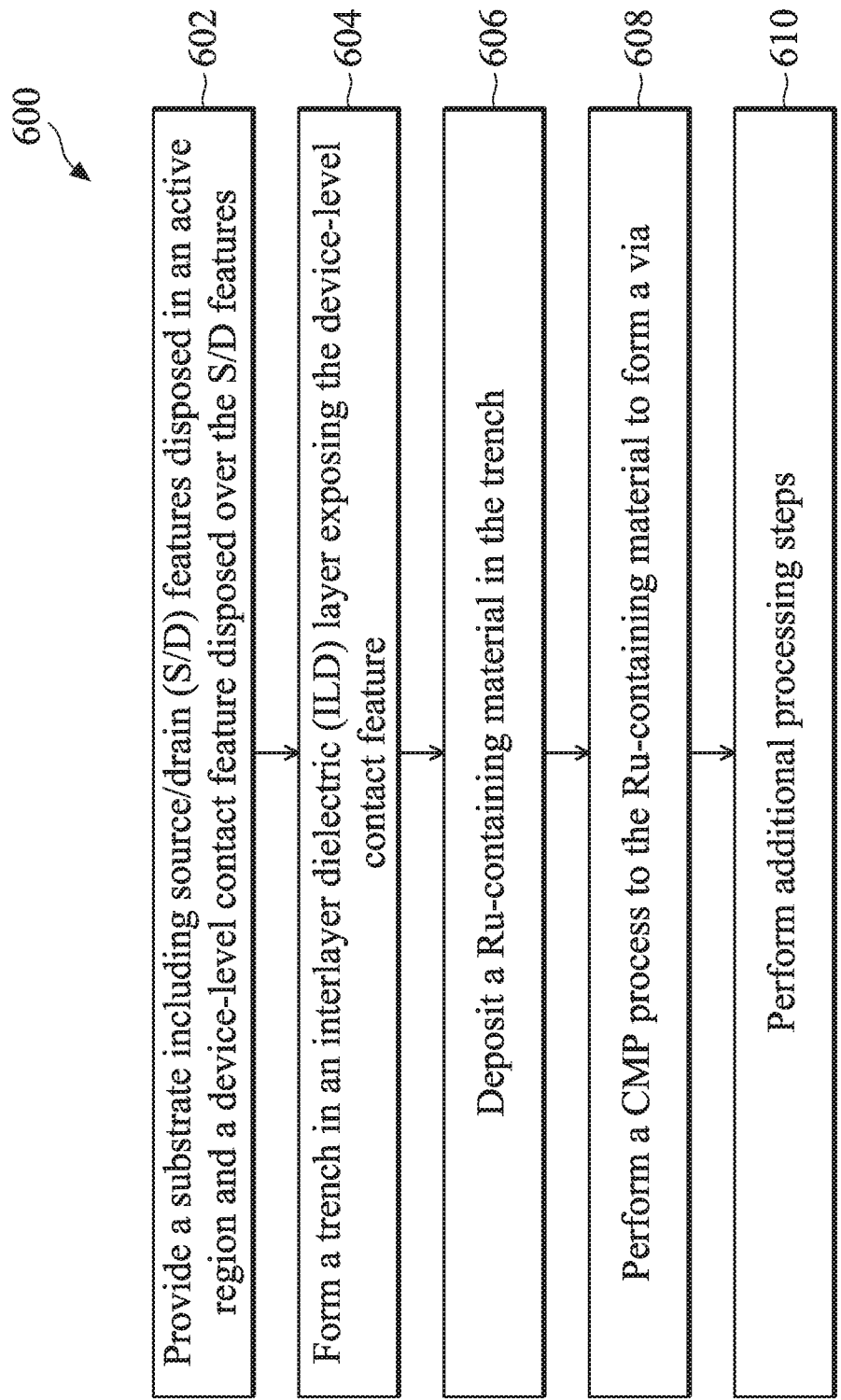
FIG. 6 is a flow chart of a method of fabricating a semiconductor device according to one or more aspects of the present disclosure.

FIG. 6 illustrates a method 600 for fabricating an FET using a CMP process with improved polishing throughput for Ru and improved removal selectivity between Ru and a surrounding dielectric material. It is understood that the method 600 includes steps having features of a complementary metal-oxide-semiconductor (CMOS) technology process flow and thus, are only described briefly herein. Additional steps may be performed before, after, and/or during the method 600.

FIGS. 7A-7F are cross-section views of an embodiment of a semiconductor device 700 during various stages of an embodiment of the method 600. It is understood that the semiconductor device 700 may include various other devices and features, such as other types of devices such as additional transistors, bipolar junction transistors, resistors, capacitors, inductors, diodes, fuses, static random-access memory (SRAM) and/or other logic circuits, etc., but is simplified for a better understanding of the embodiments of the present disclosure. In some embodiments, the semiconductor device 700 includes a plurality of semiconductor devices (e.g., transistors), including PFETs, NFETs, etc., which may be interconnected. Moreover, it is noted that the process steps of the method 600, including any descriptions given with reference to FIGS. 7A-7F, are merely examples and are not intended to be limiting beyond what is specifically recited in the claims that follow.

Figure 7A:
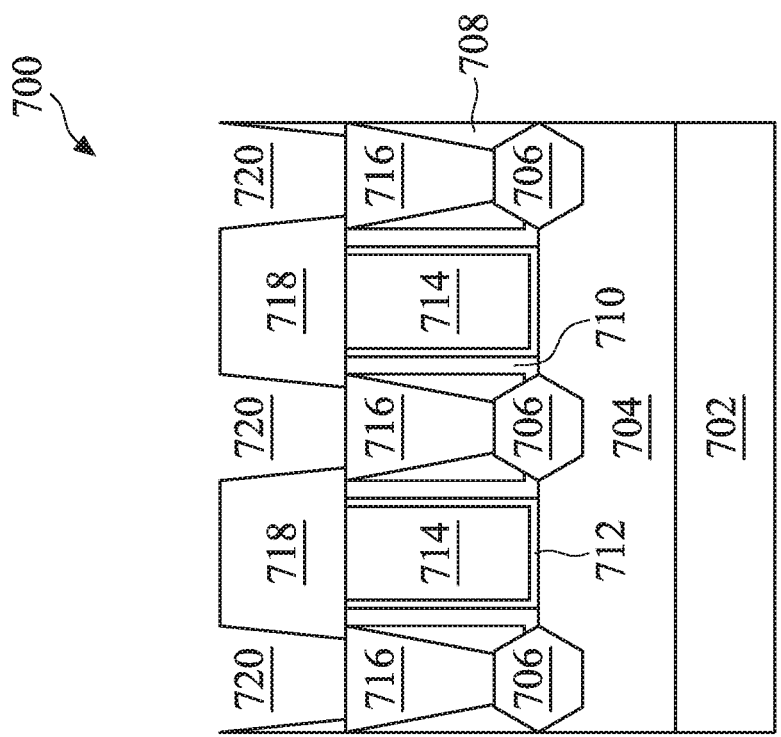
FIGS. 7A, 7B, 7C, 7D, 7E, and 7F illustrate cross-section views of an embodiment of a semiconductor device at various stages of an embodiment of the method of FIG. 6 according to one or more aspects of the present disclosure.

Referring now to FIG. 7A, the method 600 begins at block 602 where a substrate 702 including an active region 704 and an isolation region (not depicted) is provided. In some embodiments, the substrate 702 may be a semiconductor substrate such as a silicon substrate. The substrate 702 may include various layers, including conductive or insulating layers formed thereon. The substrate 702 may include various doping configurations depending on various design requirements. The substrate 702 may also include other semiconductors such as germanium, silicon carbide (SiC), silicon germanium (SiGe), or diamond. Alternatively, the substrate 702 may include a compound semiconductor and/or an alloy semiconductor. Further, the substrate 702 may optionally include an epitaxial layer (epi-layer), may be strained for performance enhancement, may include a silicon-on-insulator (SOI) structure, and/or have other suitable enhancement features. The isolation region may include silicon oxide, silicon nitride, silicon oxynitride, fluoride-doped silicate glass (FSG), a low-k dielectric material, and/or other suitable materials. The isolation structures may include shallow trench isolation (STI) features.

In some embodiments, the active region 704 includes a plurality of fins extending away from a top surface of the substrate 702. As such, the active region 704 is said to provide at least one FinFET, and the FIGS. 7A-7F illustrate cross-sectional views of the semiconductor device 700 along a direction of the fin length-wise. Alternatively, the active region 704 may provide planar FETs. The active region 704 may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The active region 704 may be doped with an n-type dopant or a p-type dopant for forming p-type FET and n-type FET, respectively. If including fins, the active region 704 may be formed using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The semiconductor device 700 further includes source/drain (S/D) features 706 disposed in the active region 704, metal gate stacks 711 disposed adjacent the S/D features 706, and S/D contacts 716 disposed over the S/D features 706. In many embodiments, the S/D features 706 may be suitable for a p-type FET device (e.g., a p-type epitaxial material) or alternatively, an n-type FET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. The S/D features 706 may be formed by any suitable techniques, such as etching processes followed by one or more epitaxy processes.

Each of the metal gate stacks 711 may include a plurality of material layers, such as a high-k dielectric layer 712 and a gate electrode 714 disposed over the high-k dielectric layer 712. The metal gate stacks 711 may further include other material layers, such as an interfacial layer, barrier layers, hard mask layers, other suitable layers, or combinations thereof. The high-k dielectric layer 712 may include a dielectric material having a high dielectric constant, for example, greater than that of thermal silicon oxide (~3.9). In one example, the high-k dielectric layer 712 may include a high-K dielectric layer such as hafnium oxide ($HfO_2$). The gate electrode 714 may include at least one work-function metal (WFM) layer and a bulk conductive layer. The gate electrode 714 may include Cu, W, Re, Jr, Co, Ni, Ti, Ag, Al, Mn, Ru, Mo, Al, other suitable metal materials or a combination thereof. Various layers of the metal gate stacks 711 may be formed by any suitable method, such as chemical oxidation, thermal oxidation, atomic layer deposition (ALD), chemical vapor deposition (CVD), physical vapor deposition (PVD), plating, other suitable methods, or combinations thereof. A polishing process (e.g., CMP) may be performed to remove excess materials from a top surface of the metal gate stacks to planarize a top surface of the semiconductor device 700.

In various embodiments, the semiconductor device 700 further includes gate spacers 710 disposed on sidewalls of the metal gate stacks 711. The gate spacers 710 may include a dielectric material, such as silicon oxide, silicon nitride, silicon carbide, silicon oxynitride, other suitable dielectric materials, or combinations thereof. The gate spacers 710 may be formed by first depositing a blanket of spacer material over the semiconductor device 700, and then performing an anisotropic etching process to remove portions of the spacer material to form the gate spacers 710 on the sidewalls of the metal gate stacks 711.

In many embodiments, the metal gate stacks 711 are formed after other components of the semiconductor device 700 (e.g., the S/D features 706) are fabricated. Such process is generally referred to as a gate replacement process, which includes forming dummy gate structures (not depicted) as placeholders for the metal gate stacks 711, forming the S/D features 706, forming an interlayer dielectric (ILD) layer 708 (and optionally a contact etch-stop layer, or CESL) over the dummy gate structures and the S/D features 706, planarizing the ILD layer 708 by, for example, CMP, to expose a top surface of the dummy gate structures, removing the dummy gate structures in the ILD layer 708 to form trenches in the active region 704, and forming the metal gate stacks 711 in the trenches to complete the gate replacement process. In some embodiments, the ILD layer 708 includes an oxygen-containing dielectric material, such as tetraethylorthosilicate (TEOS), un-doped silicate glass, or doped silicon oxide such as borophosphosilicate glass (BPSG), fluoride-doped silicate glass (FSG), phosphosilicate glass (PSG), boron doped silicon glass (BSG), other suitable dielectric materials, or combinations thereof. In the depicted embodiment, the ILD layer 708 includes an oxide-containing dielectric material. The ILD layer 218 may include a multi-layer structure having multiple dielectric materials and may be formed by a deposition process such as, for example, CVD, flowable CVD (FCVD), spin-on-glass (SOG), other suitable methods, or combinations thereof. The CESL, if included, may comprise silicon nitride, silicon oxynitride, silicon nitride with oxygen or carbon elements, other suitable materials, or combinations thereof, and may be formed by CVD, PVD, ALD, other suitable methods, or combinations thereof.

The semiconductor device 700 further includes S/D contacts 716 disposed in the ILD layer 708 and physically contacting the S/D features 706. The S/D contacts 716 are configured to connect the S/D features 706 with subsequently formed interconnect features, such as vias and conductive lines, over the semiconductor device 700. In many embodiments, the S/D contacts 716 includes a conductive material such as Cu, W, Ru, Mo, Al, Co, Ni, other suitable conductive materials, or combinations thereof. The S/D contacts 716 may be formed by first patterning the ILD layer 708 to form trenches (not depicted) to expose the S/D features 706, and depositing the conductive material by CVD, PVD, ALD, plating, other suitable methods, or combinations thereof to form the S/D contacts 716. The patterning of the ILD layer 708 may utilize a masking element (not depicted) that includes a patterned resist material (e.g., a photoresist) and etch the exposed portions of the ILD layer 708 using the masking element as an etch mask. Subsequently, one or more CMP process may be performed to planarize a top surface of the semiconductor device 700. Thereafter, as depicted in FIG. 7A, another ILD layer 718 is formed over the metal gate stacks 711 and the S/D contacts 716 to accommodate subsequent processing steps.

In some embodiments, a silicide layer (not depicted) is formed over the S/D feature 706 in the trenches prior to depositing the conductive material. The silicide layer may be formed by a deposition process such as CVD, ALD, PVD, other suitable processes, or combinations thereof. For example, a metal layer (e.g., nickel) may be deposited over the S/D features 706. Then, the semiconductor device 700 is annealed to allow the metal layer and the semiconductor materials of the S/D features 706 to react. Thereafter, the un-reacted metal layer is removed, leaving the silicide layer over the S/D features 706. In some embodiments, though not depicted, various material layers such as barrier layer, capping layer, and/or other suitable material layers are formed in the trenches prior to depositing the conductive material to form the S/D contacts 716. The various material layers may be formed by a deposition such as CVD, ALD, PVD, other suitable processes, or combinations thereof.

Figure 7B:
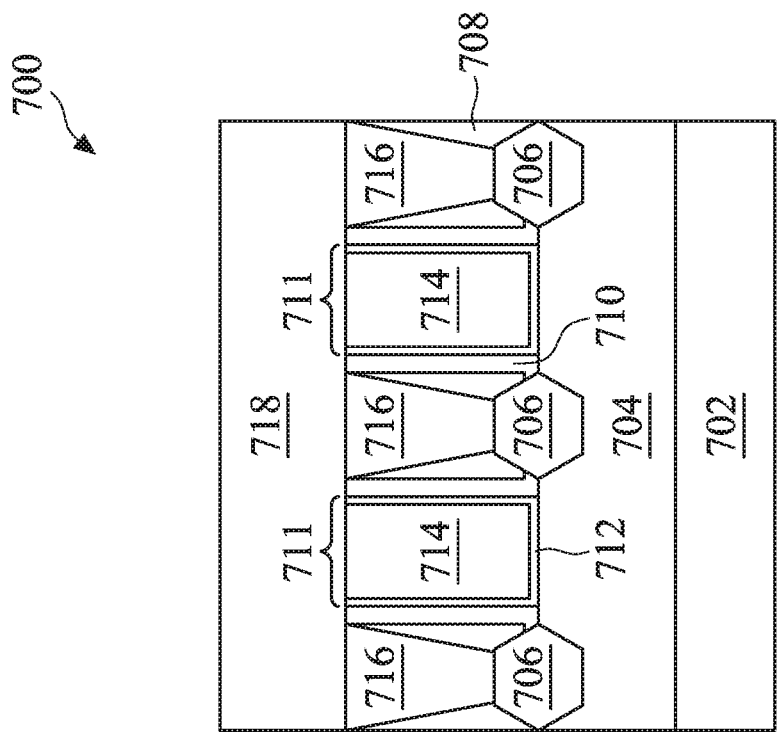

Referring to FIG. 7B, the method 600 at operation 604 forms trenches 720 in the ILD layer 718 to expose the S/D contacts 716. The trenches 720 may be formed in a series of patterning and etching processes similar to that discussed above with respect to the forming of the S/D contacts 716. Thereafter, referring to FIG. 7C, the method 600 at operation 606 deposits a conductive material 722 over the semiconductor device 700, thereby filling the trenches 720. Notably, portions of the conductive material 722 may be deposited over a top surface of the ILD layer 718. The conductive material 722 may include Ru, Co, Cu, W, Al, other suitable materials, or combinations thereof. In the depicted embodiments, the conductive material 722 includes Ru, where the amount of Ru is at least about 10% by weight. The conductive material 722 may be deposited by any suitable method, such as CVD, PVD, plating, other suitable methods, or combinations thereof. In the depicted embodiment, the conductive material 722 is deposited using CVD. Optionally, one or more barrier layer (not depicted) may be conformally deposited in the trenches 720 before depositing the conductive material 722. The one or more barrier layer may include TiN, TaN, other suitable materials, or combinations thereof and may be formed by a deposition process such as CVD, ALD, PVD, other suitable processes, or combinations thereof.

Figure 7D:
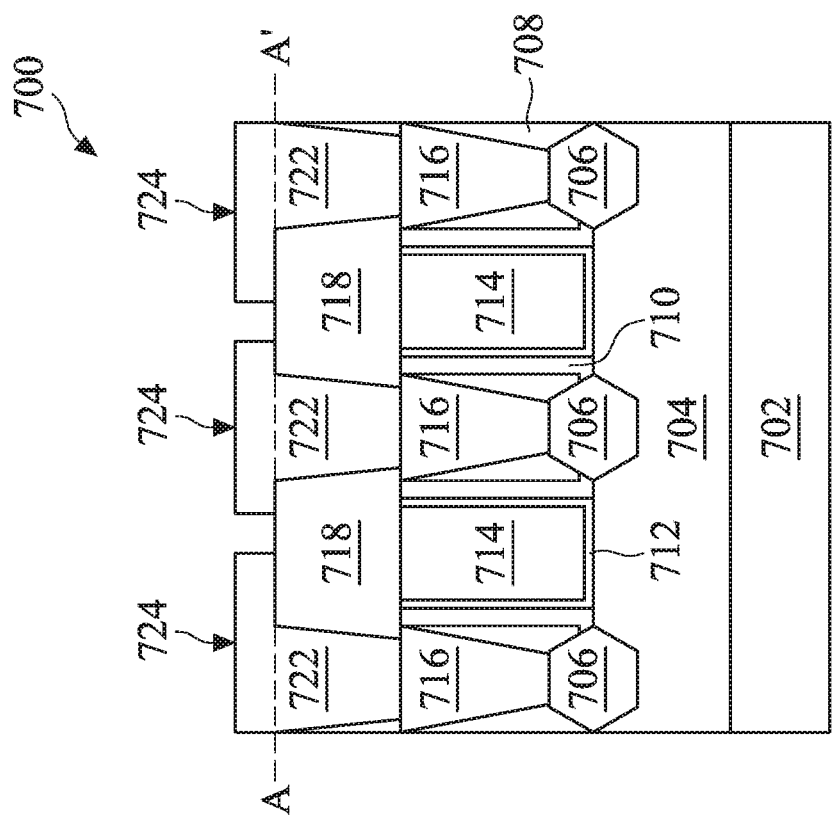
Figure 7C:
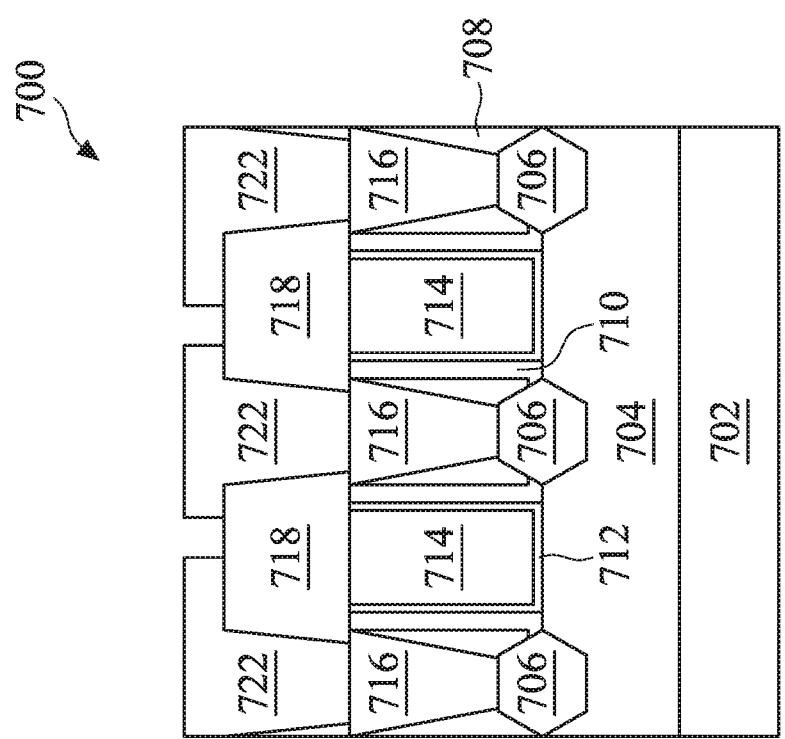
Figure 7F:
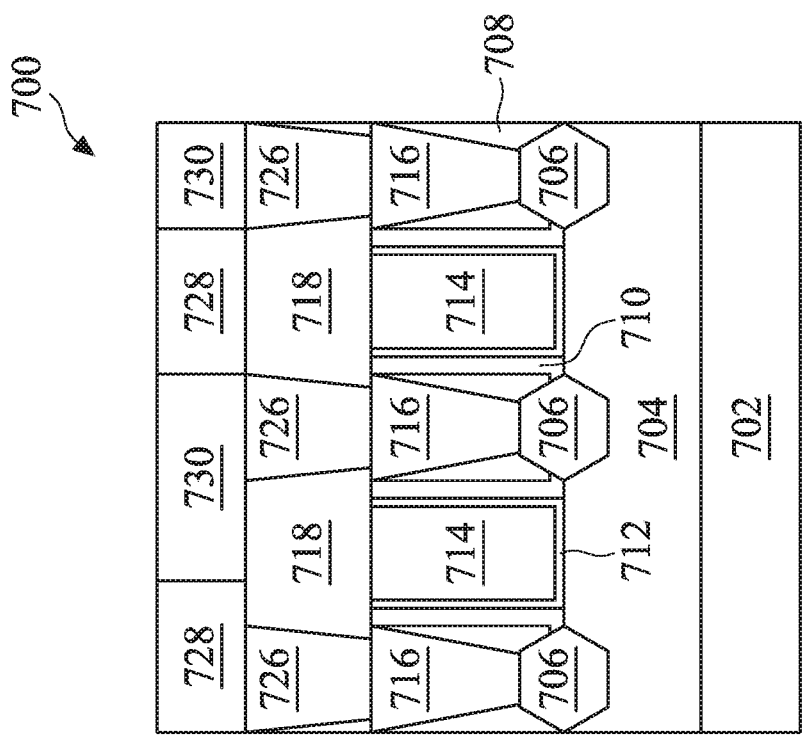
Figure 7E:
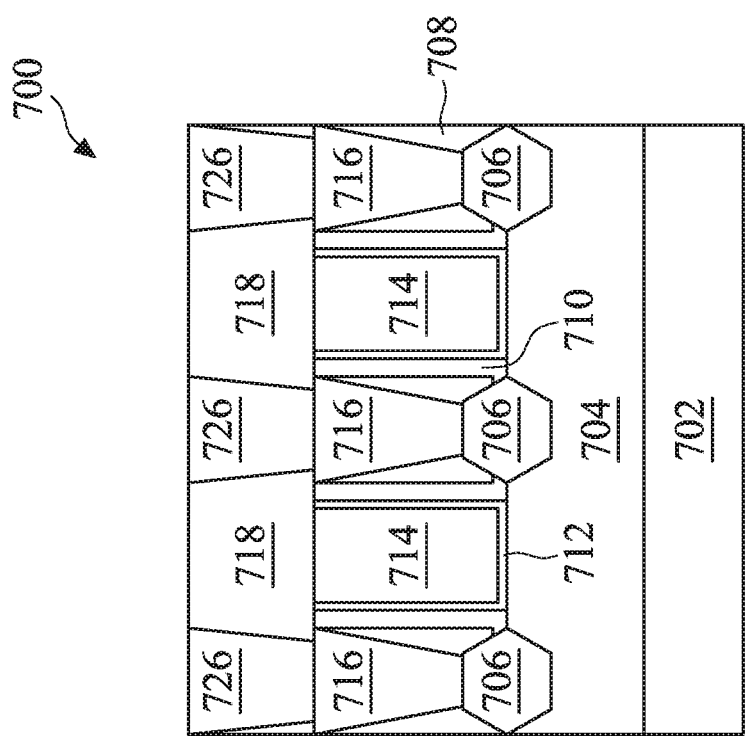

Referring to FIG. 7D, after depositing the conductive material 722 at operation 606, excess portions 724 of the conductive material 722 are formed over the top surface of the ILD layer 718 (i.e., above dashed line AA'). The method 600 at operation 608 then performs a CMP process to planarize the top surface of the semiconductor device 700, such that a top surface of the conductive material 722 may be substantially co-planar with the top surface of the ILD layer 718, as depicted in FIG. 7E. In other words, the CMP process at operation 608 removes the excess portions 724 without substantially removing portions of the ILD layer 718. In the depicted embodiment, performing the CMP process at operation 608 forms vias 726 disposed in the ILD layer 718 and over the S/D contacts 716.

In many embodiments, the CMP process at operation 608 is performed in a CMP system similar to the CMP system 100 discussed above with reference to FIG. 1A, where the excess portions 724, similar to the Ru-containing layer 118, disposed adjacent the exposed portions of the ILD layer 718, similar to the dielectric material layer 119, are polished by the polishing pad 106 using the slurry 104 as discussed in detail above. In many embodiments, components of the slurry 104, e.g., the oxidant 120 and the abrasive particles 122, react to form oxidizer such as the ROS 124 that is configured to oxidize Ru in the excess portions 724 to form $RuO_2$ and/or $RuO_3$, which is subsequently removed by the abrasive particles 122. Example mechanisms of such oxidation and removal processes have been discussed in detail above. Notably, the combination of the oxidant 120 and the abrasive particles 122 is operable to increase the rate at which the Ru is oxidized, thereby increasing the Ru RR (i.e., the RR of the excess portions 724) and the removal selectivity of Ru with respect to the adjacent ILD layer 718. In other words, the excess portions 724 are removed at a higher rate than the adjacent ILD layer 718.

The semiconductor device 700 may undergo further processing steps to form various features. For example, subsequent processing may form various contacts, vias, conductive lines, and other multilayers interconnect features (e.g., metal layers and ILD layers) over the substrate 702, configured to connect the various features to form a functional circuit that may include one or more FET devices. For example, referring to FIG. 7F, conductive lines 730 may be formed in an ILD layer 728 disposed over the ILD layer 718 and the vias 726. As such, the vias 726 are configured to connect the conductive lines 730 with the S/D contacts 716. The conductive lines 730 may include Ru and therefore be formed by a method similar to the method 600 discussed above, such that the CMP process employing the slurry 104 may be applied to the formation of the conductive lines 730. In some embodiments, a dual damascene process may be used to form one or more of the multilayer interconnection features, and the CMP process discussed herein may be performed thereafter to planarize a top surface of the resulting device.

According to various aspects of the present disclosure, a CMP slurry and methods of using the same are provided. The CMP slurry is configured to improve removal rate (RR) of Ru-containing material and removal selectivity of the Ru-containing material relative to an adjacent dielectric material. In some embodiments, the CMP slurry includes at least an oxidant and a plurality of abrasive particles. In some embodiments, the oxidant includes a compound having oxygen. In some embodiments, each abrasive particle includes a core-shell structure, where the core and the shell include different materials and may be separated during the CMP process. In further embodiments, the oxidant and the abrasive particles react to form a reactive oxygen species (ROS) capable of oxidizing the Ru-containing material at a higher rate than using oxidant alone. In various embodiments, the CMP slurry and methods of using the same provide improved polishing throughput (e.g., via higher Ru RR) and removal selectivity between the Ru-containing material and the adjacent dielectric material. While a few advantages of certain embodiments described herein have been described, other advantages of using one or more of the present embodiments may be present and no particular advantage is required for the embodiments described in the present disclosure.

In one aspect, the present disclosure provides a slurry composition for implementing a CMP process that includes an oxidant including oxygen and an abrasive particle having a core structure encapsulated by a shell structure. Specifically, the core structure includes a first compound and the shell structure includes a second compound different from the first compound, where a diameter of the core structure is greater than a thickness of the shell structure, and where the first compound is configured to react with the oxidant to form a reactive oxygen species.

In another aspect, the present disclosure provides a method that begins with providing a substrate including a ruthenium (Ru)-containing region disposed adjacent a dielectric-containing region, where a top surface of the Ru-containing region is above a top surface of the dielectric-containing region. The method then proceeds to rotating a polishing pad configured for a CMP process about an axis and providing a CMP slurry to a surface of the substrate, where the CMP slurry includes an oxidant and an abrasive. Specifically, the abrasive includes a plurality of particles each having a core surrounded by a shell, where the core includes a first oxygen-containing material and the shell includes a second oxygen-containing material different from the first oxygen-containing material, and where the first oxygen-containing material is configured to react with the oxidant to form a reactive oxygen species (ROS). Thereafter, the method proceeds to polishing the substrate using the polishing pad and the CMP slurry such that the top surface of the Ru-containing region is substantially coplanar with the top surface of the dielectric-containing region.

In yet another aspect, the present disclosure provides a method that begins with providing a substrate including source/drain (S/D) features disposed in an active region and an S/D contact disposed over the S/D features and forming a trench in an interlayer dielectric (ILD) layer disposed over the S/D contact. Thereafter, the method proceeds to depositing a ruthenium (Ru)-containing material in the trench to form a via, where the S/D contact physically connects the via to the S/D features, and where portions of the Ru-containing material are formed on a top surface of the ILD layer. Subsequently, the method proceeds to performing a CMP process to the substrate using a CMP slurry, where the CMP slurry includes an oxidant and a plurality of abrasive particles, and where each abrasive particle includes an inner layer of a first oxygen-containing material encapsulated by an outer layer of a second oxygen-containing material different from the first oxygen-containing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate including a ruthenium (Ru)-containing region disposed adjacent a dielectric-containing region, wherein a top surface of the Ru-containing region is above a top surface of the dielectric-containing region;
rotating a polishing pad configured for a chemical-mechanical polishing (CMP) process about an axis;
providing a CMP slurry to a surface of the substrate, wherein the CMP slurry includes an oxidant and an abrasive, wherein the abrasive includes a plurality of particles each having a core surrounded by a shell, the core including a first oxygen-containing material and the shell including a second oxygen-containing material different from the first oxygen-containing material, and wherein the first oxygen-containing material is configured to react with the oxidant to form a reactive oxygen species (ROS); and
polishing the substrate using the polishing pad and the CMP slurry such that the top surface of the Ru-containing region is substantially coplanar with the top surface of the dielectric-containing region.

2. The method of claim 1, wherein the core of the abrasive includes $TiO_2$, $CeO_2$, $Ce(OH)_x$, or combinations thereof, x being 3 or 4.

3. The method of claim 1, wherein the oxidant includes $H_2O_2$.

4. The method of claim 1, wherein the shell includes $Al_2O_3$, $SiO_2$, or a combination thereof.

5. The method of claim 1, wherein the polishing of the substrate exposes the first oxygen-containing material to react with the oxidant, thereby forming a reactive oxygen species (ROS).

6. The method of claim 5, wherein the polishing of the substrate includes:
oxidizing Ru contained in the Ru-containing region with the ROS to form ruthenium oxide; and
removing the ruthenium oxide with the abrasive.

7. The method of claim 6, wherein the ruthenium oxide includes $RuO_2$, $RuO_3$, or a combination thereof.

8. The method of claim 1, wherein the polishing of the substrate includes removing portions of the Ru-containing region at a higher rate than portions of the dielectric-containing region.

9. A method, comprising:
providing a substrate including a ruthenium (Ru)-containing feature disposed adjacent a dielectric feature; and
performing a chemical-mechanical polishing (CMP) process to planarize a top surface of the substrate, including:
providing a CMP slurry to the top surface of the substrate, wherein the CMP slurry includes an oxidant and a plurality of abrasive particles each having a core encapsulated by a shell, wherein the core has a first composition, and wherein the shell has a second composition different from the first composition;
contacting a polishing pad with the CMP slurry, resulting in the oxidant to react with the first composition, thereby oxidizing Ru in the Ru-containing feature to form ruthenium oxide; and
removing the ruthenium oxide to planarize the top surface of the substrate.

10. The method of claim 9, wherein the oxidant includes hydrogen peroxide.

11. The method of claim 9, wherein the first composition is free of $SiO_2$.

12. The method of claim 11, wherein the first composition includes TiO2, CeO2, Ce(OH)x, or combinations thereof, x being 3 or 4.

13. The method of claim 11, wherein the second composition includes Al2O3, SiO2, or a combination thereof.

14. The method of claim 9, wherein contacting the polishing pad with the CMP slurry removes the shell to expose the core, thereby allowing the first composition to react with the oxidant to form a reactive oxygen species (ROS) configured to oxidize the Ru in the Ru-containing feature.

15. The method of claim 9, wherein the performing of the CMP process removes portions of the Ru-containing feature at a higher rate than the dielectric feature.

16. A method, comprising:
providing a substrate including a ruthenium (Ru)-containing region disposed adjacent to a dielectric region;
polishing the Ru-containing region with respect to the dielectric region in a chemical-mechanical polishing (CMP) process, including:
rotating a platen configured with a polishing pad about an axis;
supplying a slurry including an oxidant and an abrasive to the substrate, wherein the abrasive includes a plurality of particles each having a first layer encapsulated by a second layer, wherein the first layer includes a first oxygen-based compound, and wherein the second layer includes a second oxygen-based compound different from the first oxygen-based compound; and
bringing the rotating platen into contact with the slurry to polish the Ru-containing region, wherein the polishing includes oxidizing Ru in the Ru-containing region and subsequently remove the oxidized Ru.

17. The method of claim 16, wherein:
the first oxygen-based compound includes $TiO_2$, $CeO_2$, Ce(OH)$_x$, or combinations thereof, x being 3 or 4; and
the second oxygen-based compound includes $Al_2O_3$, $SiO_2$, or a combination thereof.

18. The method of claim 17, wherein the first oxygen-based compound is free of $SiO_2$, and wherein the second oxygen-based compound includes $SiO_2$.

19. The method of claim 16, wherein the polishing includes:
separating the second layer and the first layer of the plurality of particles to expose the first oxygen-based compound; and
reacting the oxidant with the first oxygen-based compound to form a reactive oxygen species (ROS) configured to oxidize the Ru in the Ru-containing region.

20. The method of claim 19, wherein the ROS includes •OH.

* * * * *